(12) United States Patent
Xia

(10) Patent No.: US 12,111,568 B2
(45) Date of Patent: Oct. 8, 2024

(54) MASK RETICLE

(71) Applicant: CHANGXIN MEMORY TECHNOLOGIES, INC., Hefei (CN)

(72) Inventor: Yunsheng Xia, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 564 days.

(21) Appl. No.: 17/449,809

(22) Filed: Oct. 2, 2021

(65) Prior Publication Data

US 2022/0091516 A1    Mar. 24, 2022

Related U.S. Application Data

(63) Continuation of application No. PCT/CN2021/081608, filed on Mar. 18, 2021.

(30) Foreign Application Priority Data

Mar. 23, 2020   (CN) .......................... 202010206220.5

(51) Int. Cl.
*G03F 1/42*    (2012.01)
*G03F 7/00*    (2006.01)

(52) U.S. Cl.
CPC ............ *G03F 1/42* (2013.01); *G03F 7/70633* (2013.01)

(58) Field of Classification Search
CPC ................................ G03F 1/42; G03F 7/70633
USPC ............................................................ 430/5
See application file for complete search history.

(56) References Cited

U.S. PATENT DOCUMENTS

| | | | |
|---|---|---|---|
| 6,114,072 A | 9/2000 | Narimatsu | |
| 9,978,687 B1 | 5/2018 | Xuan | |
| 2001/0048145 A1 | 12/2001 | Takeuchi et al. | |

FOREIGN PATENT DOCUMENTS

| | | |
|---|---|---|
| CN | 1677616 A | 10/2005 |
| CN | 101047165 A | 10/2007 |
| CN | 101183213 A | 5/2008 |
| CN | 102096328 A | 6/2011 |
| CN | 104297989 A | 1/2015 |
| CN | 107621749 A | 1/2018 |
| CN | 112731759 A | 4/2021 |

OTHER PUBLICATIONS

International Search Report (ISR) in PCT/CN2021/081608 mailed on Jun. 1, 2021.
English translation of the Written Opinion of the International Search Authority in the international application No. PCT/CN2021/081608, mailed on Jun. 1, 2021.
CN first office action in Application No. 202010206220.5, mailed on Feb. 11, 2022.

*Primary Examiner* — Christopher G Young
(74) *Attorney, Agent, or Firm* — Syncoda LLC; Feng Ma

(57) ABSTRACT

A mask includes a first boundary area and a plurality of exposure pattern areas, the first boundary area including a region surrounding the plurality of exposure pattern areas; in the first boundary area is disposed a plurality of first overlay mark units, each of which includes a plurality of overlay marks; the plurality of overlay marks are sequentially arranged along extension directions of adjacent transversal or longitudinal first boundary lines; a plurality of first overlay mark units are symmetric in pairs with a central line of the mask as a symmetric axis, and two symmetric first overlay mark units form an overlay mark set; arrangement directions of two overlay marks in the first overlay mark units in the same overlay mark set are parallel to and displaced with respect to each other.

10 Claims, 7 Drawing Sheets

MASK RETICLE

CROSS-REFERENCE TO RELATED APPLICATIONS

This is a continuation of International Patent Application No. PCT/CN2021/081608 filed on Mar. 18, 2021, which claims priority to Chinese Patent Application No. 202010206220.5 filed on Mar. 23, 2020. The disclosures of the above-referenced applications are hereby incorporated by reference in their entirety.

BACKGROUND

With the development of the integrated circuit industry, the number of transistors formed on a wafer is increasingly large. During the process of producing and fabricating an integrated circuit, it is necessary to physically relate many layers to one another, so as to satisfy use requirement. Accordingly, each layer must be in alignment, namely overlay precision, with the foregoing layer by a certain degree, and this is one factor that constrains the level of photoetching technique; moreover, this is the time when the layout of overlay marks puts an increasingly high demand on the degree of integration, and attention should also be paid thereto.

SUMMARY

The present disclosure relates generally to semiconductor technologies, and more specifically to a mask reticle.

Various embodiments of the present disclosure provide a mask reticle, so as to realize the effects of diminishing the dimension of the boundary area, reducing the dimension ratio of the boundary area, and increasing the number of exposure pattern areas.

Provided by the embodiments of the present disclosure is a mask reticle that comprises a first boundary area and a plurality of exposure pattern areas; the plurality of exposure pattern areas are arranged in an array, the first boundary area includes a region surrounding the plurality of exposure pattern areas; in the first boundary area is disposed a plurality of first overlay mark units, each of which includes a plurality of overlay marks, the first boundary area is provided with transversal and longitudinal first boundary lines corresponding to the plurality of exposure pattern areas arranged in an array, and the plurality of overlay marks are sequentially arranged along extension directions of adjacent transversal or longitudinal first boundary lines; the plurality of first overlay mark units are symmetric in pairs with a central line of the mask reticle as a symmetric axis, and two mutually symmetric first overlay mark units form an overlay mark set; arrangement direction of the overlay marks in one of the first overlay mark units in the same overlay mark set is parallel to arrangement direction of the overlay marks in another one of the first overlay mark units, and, on the arrangement directions of the overlay marks, one overlay mark in the first overlay mark units is displaced with respect to another overlay mark in the first overlay mark units.

BRIEF DESCRIPTION OF DRAWINGS

The aforementioned and other features and advantages of the present disclosure will be made more apparent by describing the exemplary embodiments in detail with reference to the accompanying drawings.

DETAILED DESCRIPTION

Further detailed descriptions are made below in conjunction with accompanying drawings and embodiments. As can be understood, the specific embodiments described in this context are merely meant to explain, rather than to restrict, the present disclosure. As should be additionally pointed out, to facilitate description, only the part relevant to the present disclosure, rather than the entire structure, is illustrated in the accompanying drawings.

Typically, overlay marks define the number of exposure regions of a mask reticle, and this is not conducive to the arrangement of chips.

Figure 1:
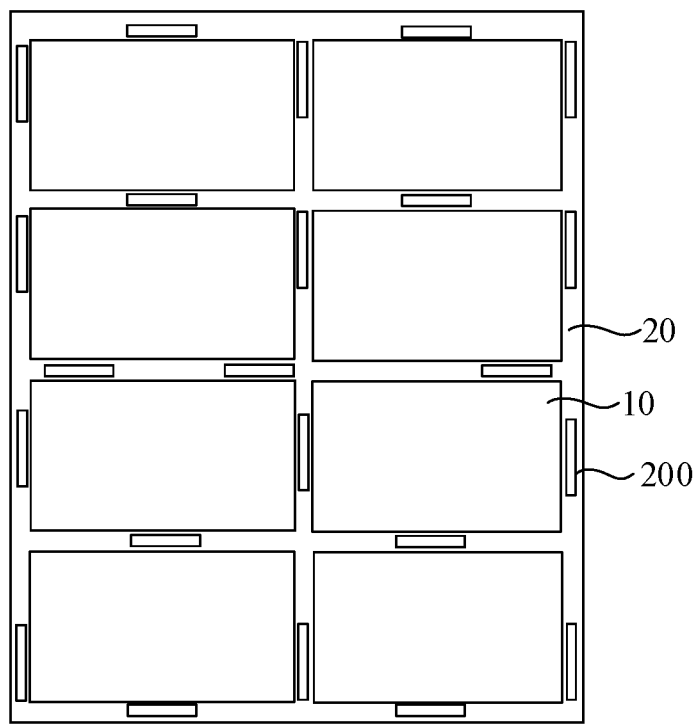
FIG. 1 is a diagram schematically illustrating a structure of a mask reticle.
Figure 2:
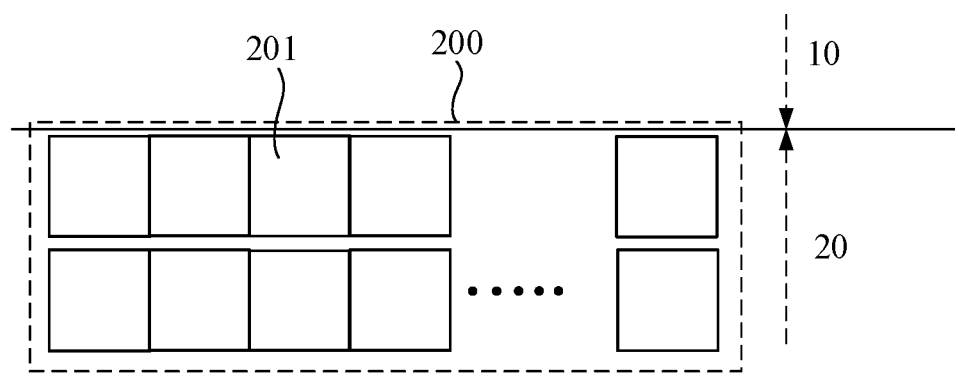
FIG. 2 is a diagram schematically illustrating the lower part of the mask reticle in amplification shown in FIG. 1.

FIG. 1 is a diagram schematically illustrating the structure of A mask reticle, and FIG. 2 is a diagram schematically illustrating the lower part of the mask reticle in amplification shown in FIG. 1. Referring to FIGS. 1 and 2, the mask reticle usually comprises 2×4 exposure pattern areas 10, and boundary area 20 is disposed between adjacent exposure pattern areas 10 and to the periphery of the exposure pattern areas 10, of which the exposure pattern areas 10 are employed to transfer patterns onto a wafer, so as to form chips (also referred to as "dies") on the wafer, in other words, 2×4 chips can be transferred and formed at a time by the mask reticle.

As shown in the drawings, the boundary area 20 is provided with a plurality of overlay mark units 200 to guarantee overlay precision. In each overlay mark unit 200 are included two rows or two columns of overlay marks 201. However, two rows or two columns of overlay marks 201 limits the reduction in width of the boundary area 20, so that the dimension of the boundary area 20 is unduly large; under the circumstance the size of the mask reticle is definite, it is only possible to set a fixed number of exposure pattern areas, that is to say, the number of chips as formed is restricted.

Figure 3:
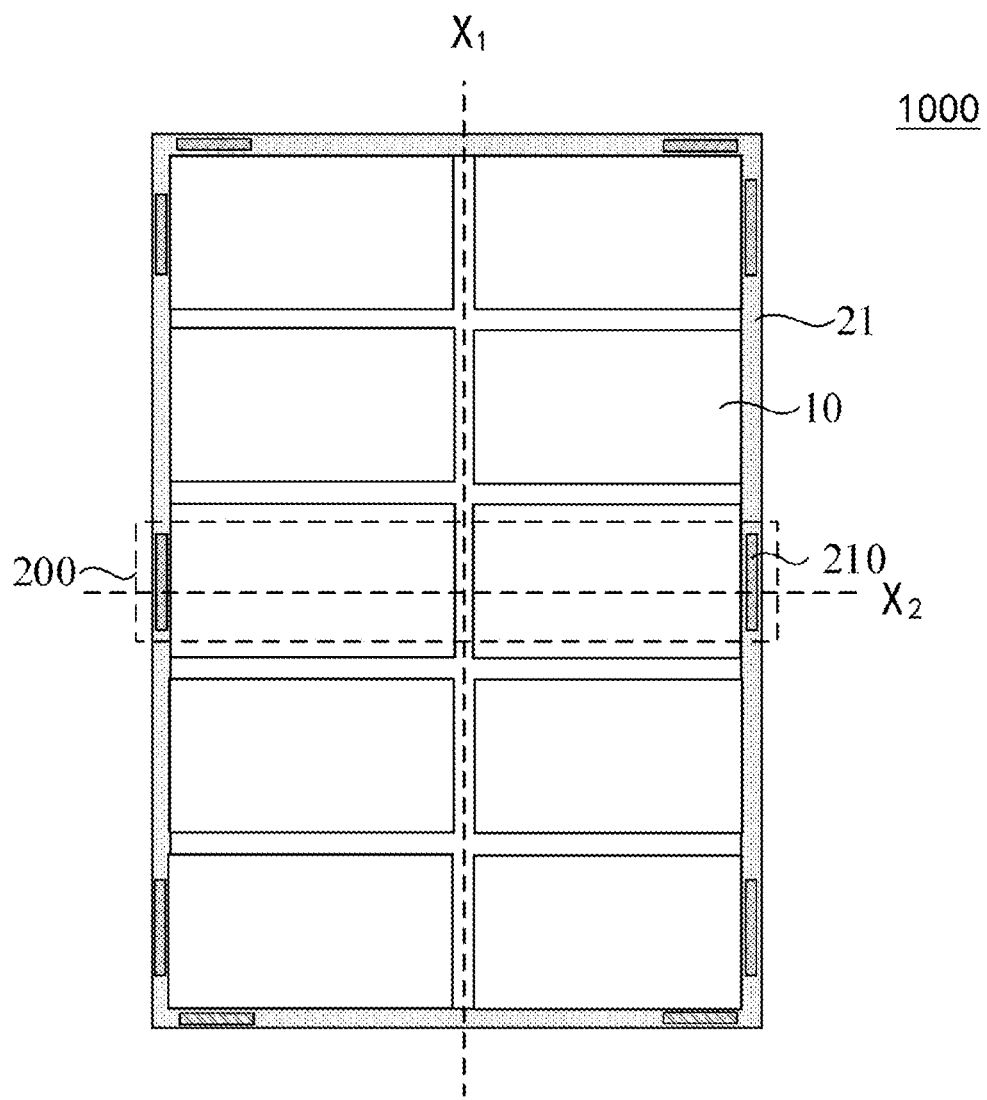
FIG. 3 is a diagram schematically illustrating the structure of the mask reticle provided by an embodiment of the present disclosure.
Figure 4:
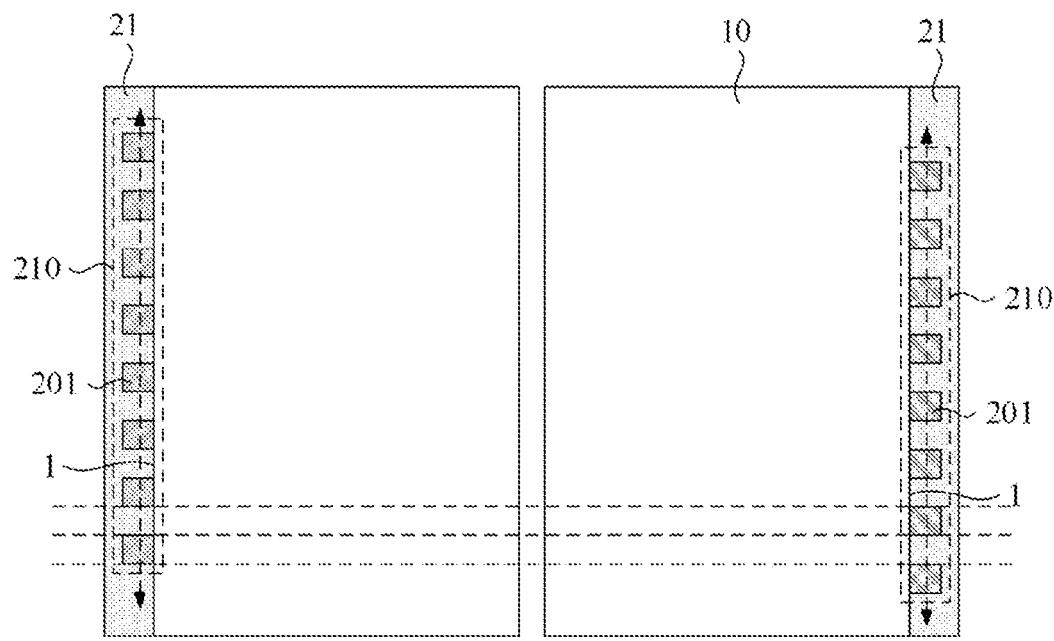
FIG. 4 is a diagram schematically illustrating the part of the mask reticle in amplification shown in FIG. 3 framed by dotted lines.

FIG. 3 is a diagram schematically illustrating the structure of mask reticle 1000 provided by an embodiment of the present disclosure, and FIG. 4 is a diagram schematically illustrating the part of the mask reticle 1000 in amplification shown in FIG. 3 framed by dotted lines. Referring to FIGS. 3 and 4, the mask reticle 1000 comprises a first boundary area 21 and a plurality of exposure pattern areas 10; the plurality of exposure pattern areas 10 are arranged in an array, the first boundary area 21 includes a region surrounding the plurality of exposure pattern areas 10; in the first boundary area 21 is disposed a plurality of first overlay mark units 210, each of which includes a plurality of overlay marks 201, the first boundary area 21 is provided with transversal and longitudinal first boundary lines 1 corresponding to the plurality of exposure pattern areas 10 arranged in an array, and the plurality of overlay marks 201 are sequentially arranged along extension directions of adjacent transversal or longitudinal first boundary lines 1.

The plurality of first overlay mark units 210 are symmetric in pairs with a central line of the mask reticle 1000 as a symmetric axis, and two mutually symmetric first overlay mark units 210 form an overlay mark set 200; arrangement direction of the overlay marks 201 in one of the first overlay mark units 210 in the same overlay mark set 200 is parallel to arrangement direction of the overlay marks 201 in another one of the first overlay mark units 210, and, on the arrangement directions of the overlay marks 201, one overlay mark 201 in the first overlay mark units 210 is displaced with respect to another overlay mark 201 in the first overlay mark units 210.

The mask reticle 1000 is used to transfer exposure patterns onto wafer 2000, so as to form an integrated circuit on chips. Except for the exposure pattern areas 10 in the mask reticle 1000, all remaining regions are the boundary area, while the first boundary area 21 essentially indicates the peripheral area of the boundary area that surrounds the exposure pattern areas 10. Disposing a plurality of first overlay mark units 210 in the first boundary area 21, each of which first overlay mark units 210 includes a plurality of overlay marks 201, makes it possible to make use of the overlay marks 201 to guarantee precise alignment during overlay of the mask reticle 1000. Moreover, the first boundary area 21 and each exposure pattern area 10 together form a boundary line; for the plurality of exposure pattern areas 10 arranged in an array, the first boundary area 21 forms transversally or longitudinally extending first boundary lines 1, and when each first overlay mark unit 210 is disposed at the peripheral region of the exposure pattern areas 10, namely at the first boundary area 21, it will adjoin an exposure pattern area 10. When the plurality of overlay marks 201 in the first overlay mark units 210 are arranged along the extension direction of the adjoining first boundary line 1, namely when the first boundary line 1 is transversal, the plurality of overlay marks 201 in the adjacent first overlay mark units 210 are transversally arranged; when the first boundary line 1 is longitudinal, the plurality of overlay marks 201 in the adjacent first overlay mark units 210 are longitudinally arranged, whereby it is guaranteed that the length of the overlay mark units 210 on the direction perpendicular to the first boundary line 1 is relatively less. In other words, the transversally arranged overlay marks 201 as shown in the Figures can guarantee relatively less width on the longitudinal direction, while the longitudinally arranged overlay marks 201 can guarantee relatively less width on the transversal direction, thereby making it possible to reduce the widths of the different regions in the first boundary area, and reduce the dimension of the first overlay mark units 210 at the first boundary area 21.

Figure 5:
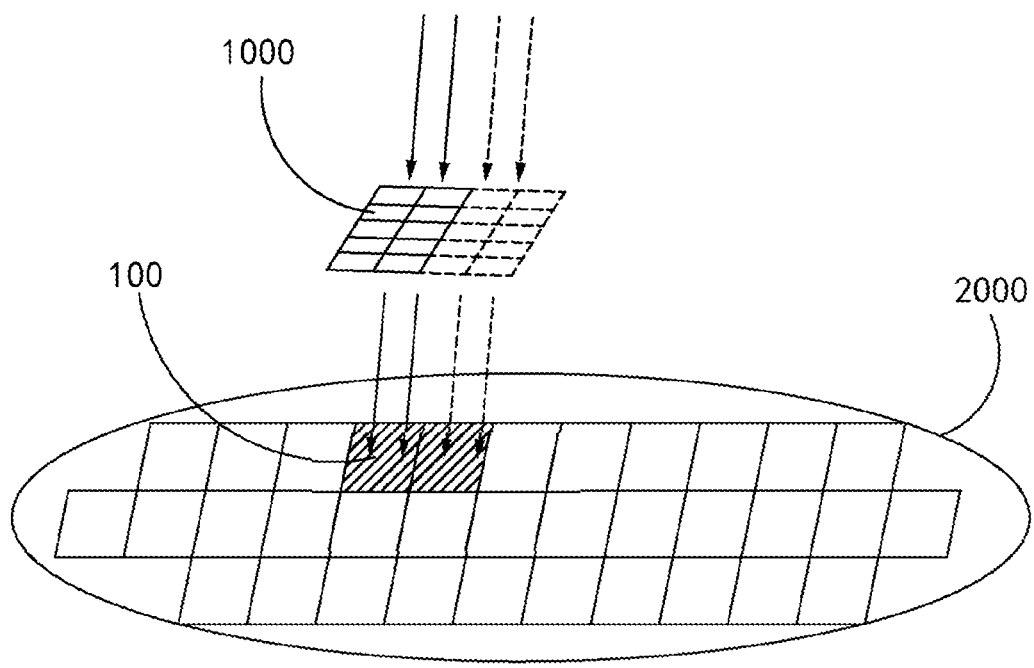
FIG. 5 is a diagram schematically illustrating the mask reticle provided by an embodiment of the present disclosure exposing a wafer.
Figure 6:
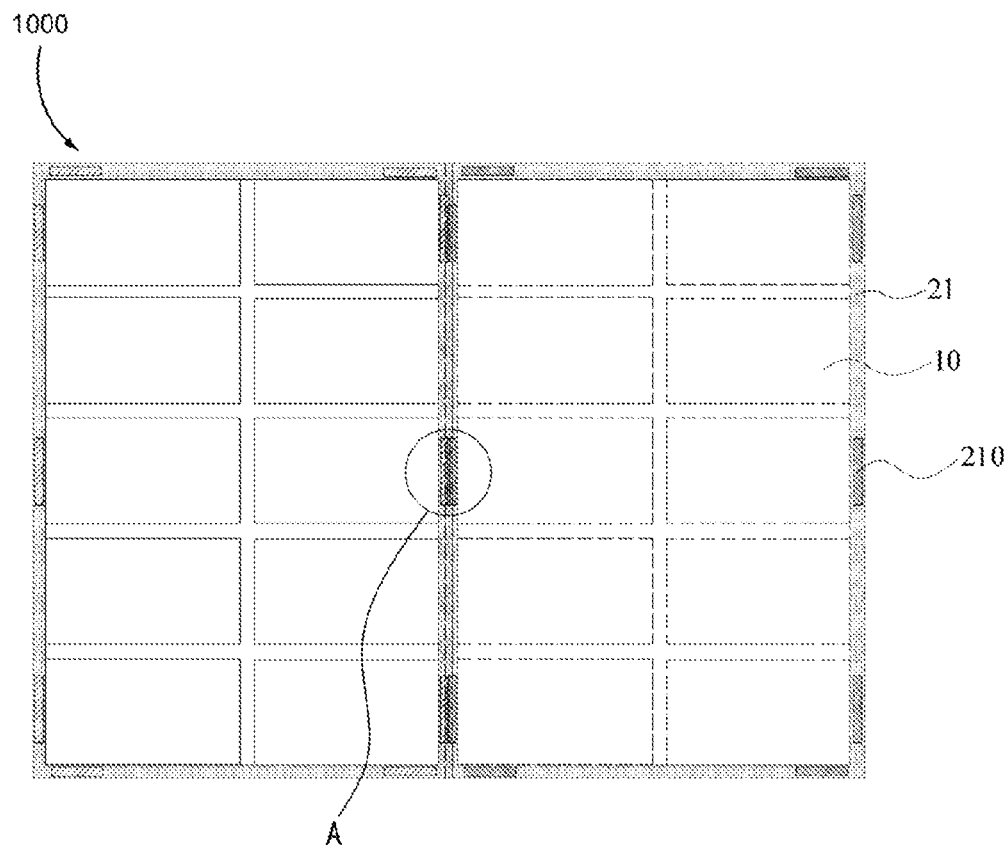
FIG. 6 is an overhead diagram schematically illustrating the mask reticle exposure shown in FIG. 5.
Figure 7:
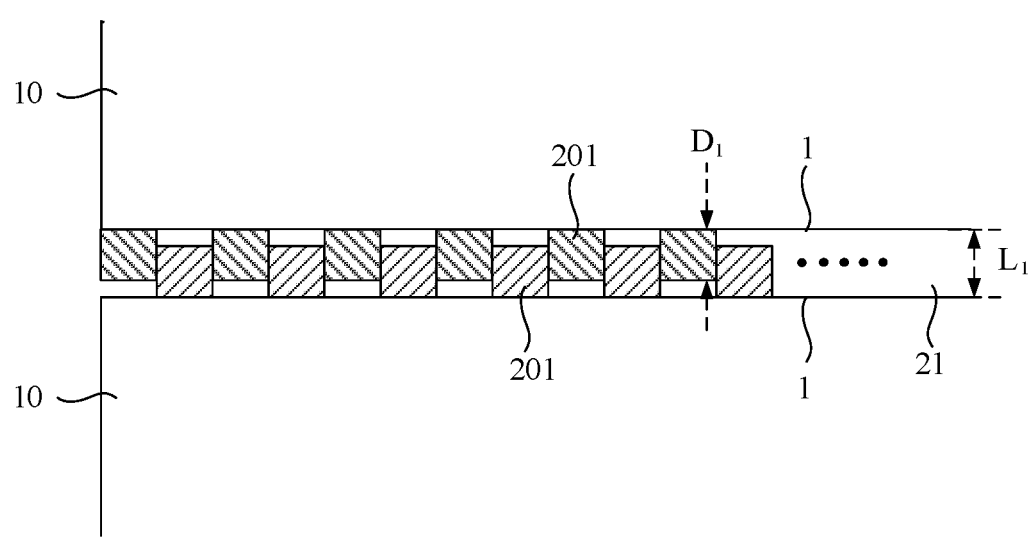
FIG. 7 is a diagram schematically illustrating the part A in amplification shown in FIG. 6.

As should be additionally noted, generally speaking, as shown in FIG. 5, when chips are fabricated via photoetching technique on wafer 2000, each wafer 2000 can be divided into plural exposure fields (also referred to as "shots") 100, each exposure field 100 is gradually exposed via the same and single mask reticle 1000, so that plural chips can be formed on the wafer 2000. FIG. 5 is a diagram schematically illustrating mask reticle 1000 exposing two adjacent exposure fields 100 on wafer 2000. The exposure fields are located right below the mask reticle 1000. The mask reticle 1000 gradually exposes the exposure fields 100, and the mask reticle 1000 shown by dotted lines has moved right above the adjacent exposure fields 100 under the current state; refer at the same time to FIG. 6, which is an overhead view of the mask reticle 1000 performing exposure in FIG. 5, so as to more clearly show the positional relationship between the two exposure fields 100 being exposed and the mask reticle 1000 above them. As can be known from the Figure, the mask reticle 1000 is in the process of gradual exposure, and the distance between the adjacent exposure fields is decided by the width of the first boundary area 21 on the mask reticle 1000. The width here indicates the width of that region of the first boundary area 21 where overlay mark units 210 are disposed. FIG. 7 is a diagram schematically illustrating partial structure of two positions when the mask reticle 1000 performs exposure and mask as shown in FIG. 6; these two positions indicate the positions of the boundary area between two exposure fields 100 on the wafer 2000 during exposure. Referring to FIGS. 3 through 7, since the first overlay mark units 210 on the mask reticle 1000 are symmetric in pairs with a central line of the mask reticle 1000 as a symmetric axis, the first overlay mark units 210 are distributed at the upper and lower sides and/or left and right sides of the plural exposure pattern areas 10, that is to say, two first overlay mark units 210 corresponding each other at the left and right two sides together form an overlay mark set 200, and overlay marks 201 therein are longitudinally arranged, as shown in FIG. 3, the first overlay mark units 210 at the left and right two sides are symmetric in pairs with the first central line X1 of the mask reticle 1000 as a symmetric axis; two first overlay mark units 210 corresponding each other at the upper and lower two sides together form an overlay mark set 200, and overlay marks 201 therein are transversally arranged, as shown in FIG. 3, the first overlay mark units 210 at the upper and lower two sides are symmetric in pairs with the second central line X2 of the mask reticle 1000 as a symmetric axis. As should be noted, the wording "symmetric in pairs with a central line . . . as a symmetric axis" recorded in the embodiments of the present disclosure can be understood as follows: the first overlay mark units 210 disposed at the upper and lower two sides and/or left and right two sides of the exposure pattern areas 10 are at least partially overlapped at the region of the projection along the direction perpendicular to its symmetric axis; further referring to FIG. 4, overlay mark units 210 disposed at the left and right two sides of the exposure pattern areas 10 are displaced up and down. During the process of exposure, it is required for the mask reticle 1000 to translate left and right or up and down over two adjacent exposure fields 100 on the wafer 2000. Moreover, the distance between two positions of two exposure fields 100 to which the mask reticle 1000 corresponds is decided by the width of the first boundary area 21 on the mask reticle 1000. On the arrangement directions of the overlay marks 201, one overlay mark 201 in the first overlay mark units 210 of the same overlay mark set 200 is displaced with respect to another overlay mark 201 in the first overlay mark units 210, in other words, overlay marks 201 in two up-and-down symmetric or left-and-right symmetric first overlay mark units 210 are sequentially displaced with respect to one another, whereby it is made possible that the positions of the two exposure fields overlap on the first boundary area 21 of the mask reticle 1000, while FIG. 7 only exemplarily shows the state of overlapping by two up-and-down positions on the first boundary area 21 of the mask reticle 1000. Apparently, by sequentially arranging the overlay marks 201 along the extension direction of the first boundary line 1, it is possible to shorten the width of the first boundary area 21, and by displacing the overlay marks 201 in the two mutually symmetric first overlay mark units 210 with respect to one another, it is possible to realize partial overlap of two positions at the first boundary area 21 of the mask reticle 1000, whereby it is possible to reduce the distance between two exposure fields 100 of the wafer 2000, and to increase the utilization ratio of the wafer.

In the mask reticle 1000 provided by the embodiment of the present disclosure, through the settings that a first boundary area and a plurality of exposure pattern areas are provided, the plurality of exposure pattern areas are arranged in an array, the first boundary area includes a region surrounding the plurality of exposure pattern areas, in the first boundary area is disposed a plurality of first overlay mark units, each of which includes a plurality of overlay marks, the plurality of overlay marks are sequentially arranged along extension directions of adjacent transversal or longitudinal first boundary lines, arrangement direction of the overlay marks in one of the first overlay mark units in the same overlay mark set is parallel to arrangement direction of the overlay marks in another one of the first overlay mark units, and, on the arrangement directions of the overlay marks, one overlay mark in the first overlay mark units is displaced with respect to another overlay mark in the first overlay mark units, it is possible to reduce the width of the first boundary area of the mask reticle 1000, to thereby reduce the dimension of the first boundary area on the mask reticle 1000. Moreover, in the process of exposing the wafer 2000, it is realized that the first boundary area is partially overlapped, and this further reduces the distance between two exposure fields in the process of exposing the wafer 2000. The mask reticle provided by the embodiments of the present disclosure solves the problem in which related mask reticle 1000 layout constrains the number of wafer chips, diminishes the dimension of the boundary area, meanwhile reduces the distance between exposure fields, enhances the utilization ratio of wafers, and improves the production efficiency of chips.

As should be noted, the region on the wafer 2000 corresponding to the boundary area of the mask reticle 1000 is essentially the cutting path of the wafer 2000 used to cut and separate the chips. On the basis of the mask reticle 1000 provided by the aforementioned embodiment, under the circumstance in which the width of the cutting path is determined, or the width of the first boundary area of the mask reticle 1000 is determined, sizes of the overlay masks can be reasonably set to contain the overlay marks for overlay alignment. Referring further to FIG. 7, specifically, taking the length of the first boundary area 21 perpendicular to the direction of the adjacent transversal or longitudinal first boundary lines 1 as $L_1$, and taking the length of the overlay mark 201 perpendicular to the direction of the transversal or longitudinal first boundary line 1 as $D_1$, where $L_1$ and $D_1$ satisfy the relational expression: $D_1 \leq L_1 \leq 2D_1$. In another embodiment, $D_1$ can be set to satisfy the expression: $4D_1/3 \leq L_1 \leq 2D_1$. Considering that it is necessary to reasonably set the position of each exposure field corresponding to the mask reticle 1000 during the process of performing mask and exposure by the mask reticle 1000 on each exposure field, whereas two adjacent exposure fields corresponding to the mask reticle 1000 may be partially overlapped at their boundary regions, therefore, in order to prevent overlay marks 201 at the boundary regions from being overlapped and covered, $L_1$ and $D_1$ can be set to satisfy the expression: $4D_1/3 \leq L_1$.

By this time, sizes of the overlay marks 201 are relatively reasonable, and can satisfy the need for layout on the first boundary area 21. Moreover, setting of the size of an overlay mark 201 to be at least one half that of the width of the first boundary area 21 can reduce waste of the first boundary area 21. At the same time, the size of the overlay mark 201 can be set as less than three fourths that of the width of the first boundary area 21, and this would leave out a certain distance between the overlay mark 201 and the edge of the mask reticle 1000, thereby preventing the overlay mark from being damaged when it is disposed at the edge of the mask reticle 1000. As should be noted, the above description is merely intended to explain the numerical relationship between the size of the overlay mark 201 and the width of the first boundary area 21. During actual design, it is possible to preferentially set the width of the first boundary area 21 first, and then to set the size of the overlay mark 201 according to the width of the first boundary area 21. It is also possible to preferentially set the size of the overlay mark 201 first, and then to set the width of the first boundary area 21 according to the size of the overlay mark 201.

The overlay precision of the mask reticle 1000 is not only decided by the number of overlay marks, but also decided by the positions of the overlay marks. Referring further to FIG. 3, the aforementioned mask reticle 1000 includes four sides, every two opposite the other and end to end with respect to each other, in order to guarantee overlay precision, the first overlay mark units 210 can be disposed on at least two end positions of each side. By this time, overlay alignment of the mask reticle 1000 not only satisfies alignment with respect to a certain direction, but also prevents errors generated by rotation, thereby enhancing overlay precision.

Figure 8:
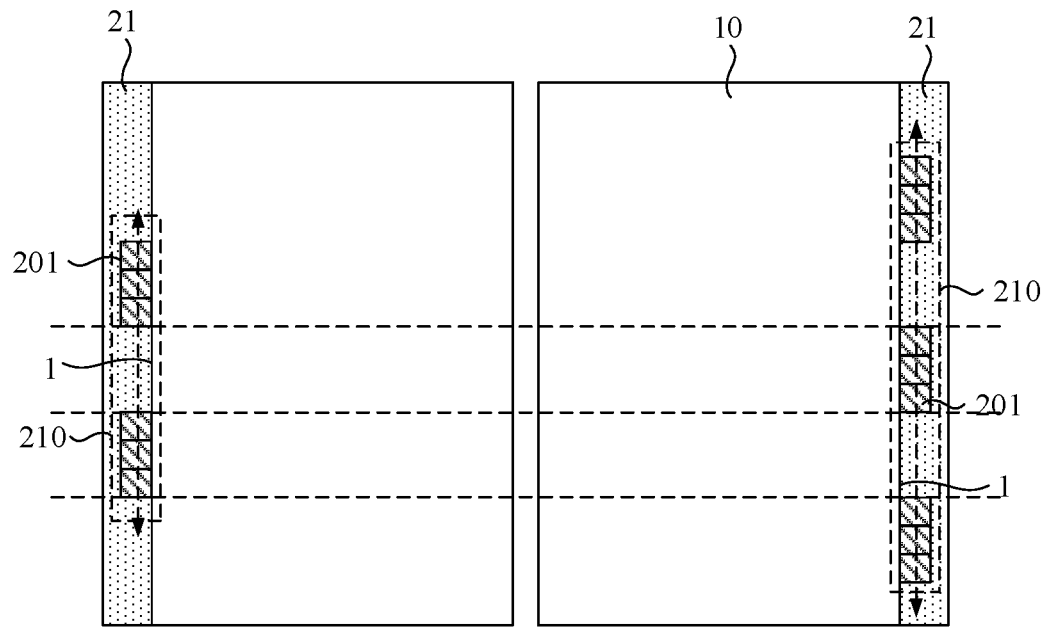
FIG. 8 is a diagram schematically illustrating partial structure of another mask reticle provided by an embodiment of the present disclosure.
Figure 9:
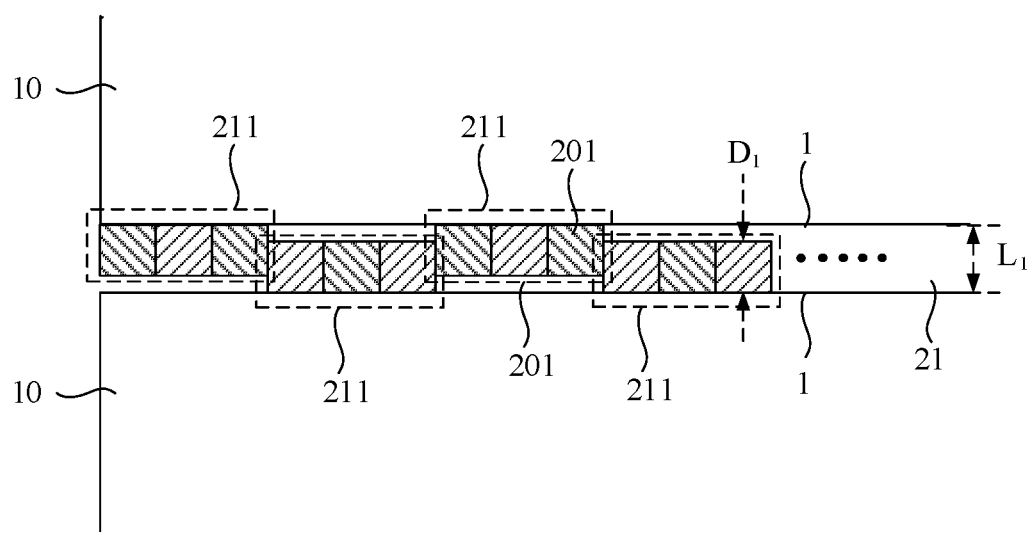
FIG. 9 is a diagram schematically illustrating partial structure of two positions of the mask reticle performing exposure and mask shown in FIG. 8.

Furthermore, in the mask reticle 1000 shown in FIG. 3, the setting that overlay marks in two overlay mark units of the same set are displaced with respect to one another is merely by way of example, while an embodiment of the present disclosure further provides a mask reticle 1000. FIG. 8 is a diagram schematically illustrating partial structure of another mask reticle provided by an embodiment of the present disclosure, and FIG. 9 is a diagram schematically illustrating partial structure of two positions of the mask reticle performing exposure and mask shown in FIG. 8. Referring to FIGS. 8 and 9, in this mask reticle 1000, the first overlay mark unit 210 includes at least one overlay mark subunit 211, each including a plurality of the overlay marks 201; on the arrangement directions of the overlay marks 201, the overlay mark subunit 211 in one of the first overlay mark units 210 in the same overlay mark set 200 is displaced with respect to the overlay mark subunit 211 in another one of the first overlay mark units 210.

Figure 10:
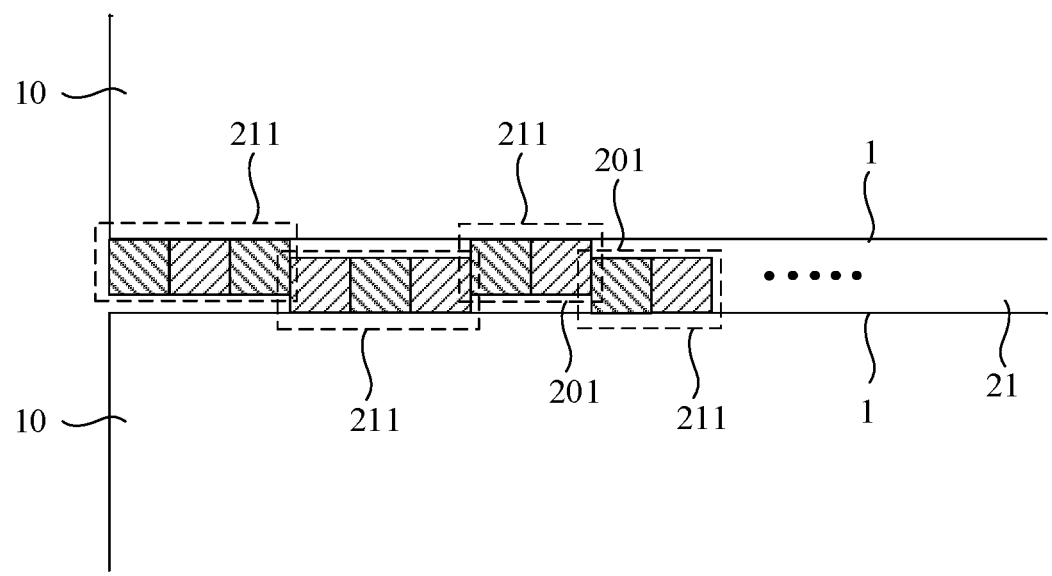
FIG. 10 is a diagram schematically illustrating partial structure of two positions of another mask reticle provided by an embodiment of the present disclosure performing exposure and mask.

Typically, 50 to 100 overlay marks can be disposed in each overlay mark unit, while plural overlay mark subunits 211 are divided and formed, it is possible to include three to five overlay marks in each overlay mark subunit. As should be noted, the number(s) of the overlay marks in each overlay mark subunit 211 can be identical, and of course the number(s) of the overlay marks in each overlay mark subunit 211 can also be set different. FIG. 10 is a diagram schematically illustrating partial structure of two positions of another mask reticle provided by an embodiment of the present disclosure performing exposure and mask. Referring to FIG. 10, the numbers of the overlay marks 201 in any random two adjacent overlay mark subunits 211 can be set different.

Figure 11:
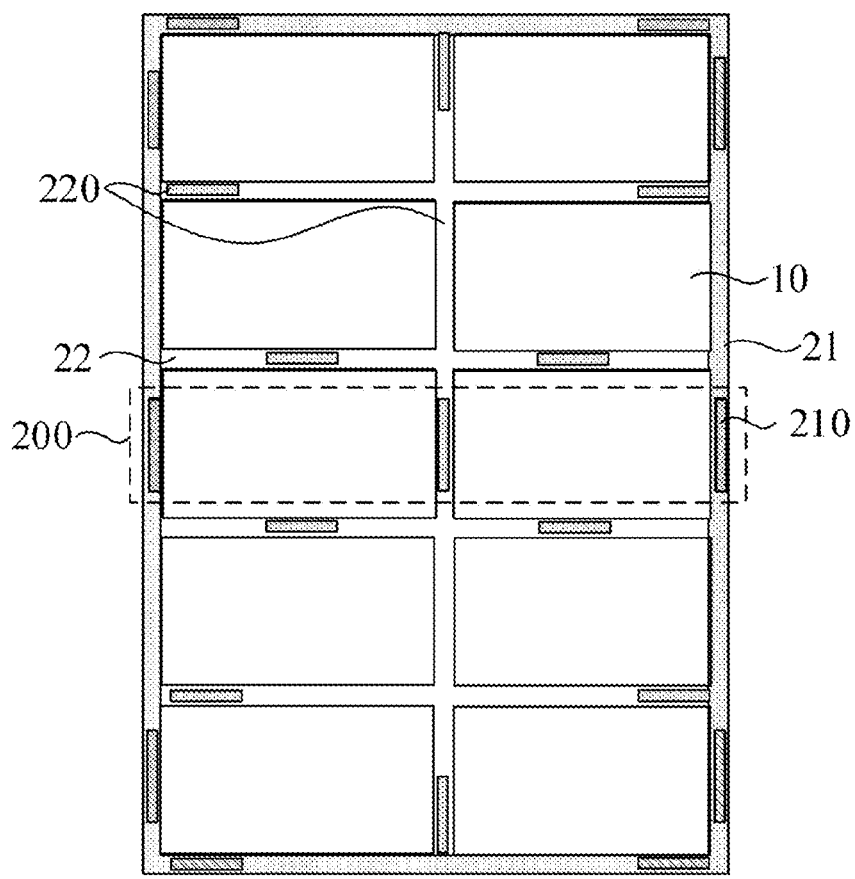
FIG. 11 is a diagram schematically illustrating the structure of yet another mask reticle provided by an embodiment of the present disclosure.
Figure 12:
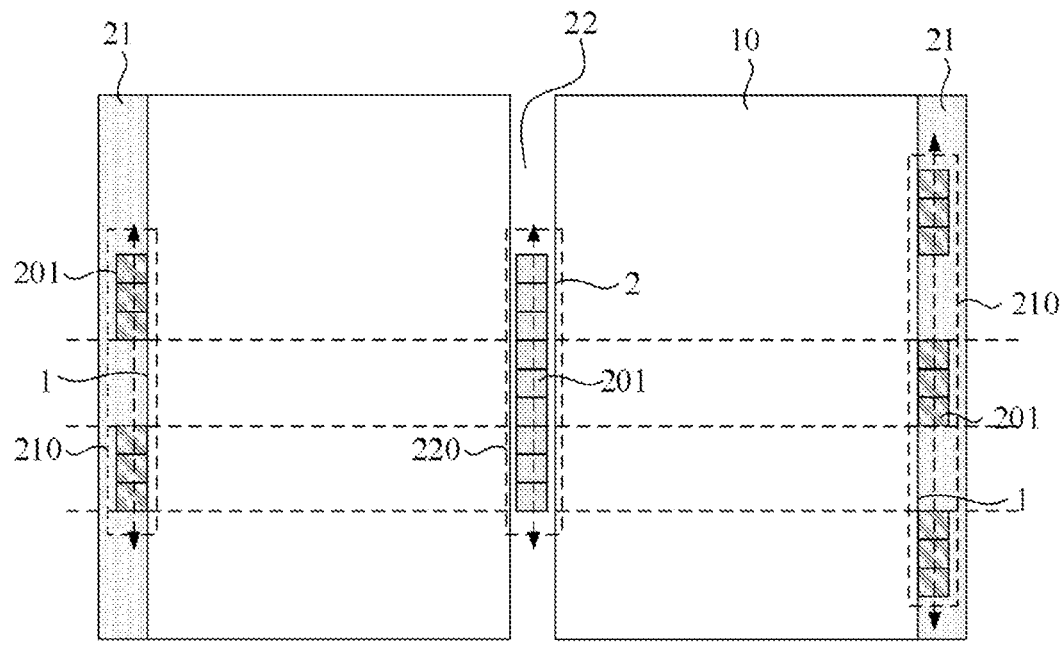
FIG. 12 is a diagram schematically illustrating the part of the mask reticle in amplification shown in FIG. 11 framed by dotted lines.

As noted above, the region on the wafer 2000 corresponding to the boundary area of the mask reticle 1000 is essentially the cutting path of the wafer, boundary areas also exist among the plural exposure pattern areas on the mask reticle 1000, so overlay marks can also be disposed in these boundary areas. On the basis thereof, an embodiment of the present disclosure further provides a mask reticle 1000. FIG. 11 is a diagram schematically illustrating the structure of yet another mask reticle provided by an embodiment of the present disclosure, and FIG. 12 is a diagram schematically illustrating the part of the mask reticle in amplification shown in FIG. 11 framed by dotted lines. Referring to FIGS. 11 and 12, on the basis of the mask reticle 1000 provided by the foregoing embodiments, this mask reticle 1000 further comprises a second boundary area 22 that includes a region between any two of the exposure pattern areas 10; in the second boundary area 22 is disposed a plurality of second overlay mark units 220, each of which includes a plurality of overlay marks 201.

The second boundary area 22 is provided with transversal and longitudinal second boundary lines 2 corresponding to the plurality of exposure pattern areas arranged in an array, and the plurality of overlay marks 201 are sequentially arranged along extension directions of adjacent transversal or longitudinal second boundary lines 2.

The second boundary area 22 essentially indicates the region between adjacent exposure pattern areas 10 in the boundary area, and the second overlay mark units 220 indicate the units formed by overlay marks located in the second boundary area 22. Adding overlay marks in the second boundary area 22 can increase reference to overlay alignment, and enhance overlay precision.

In order to reduce the distance between various exposure pattern areas 10 and enhance utilization area of the mask reticle 1000, specifically, as shown in FIG. 12, it can be set that the plural overlay marks 201 in each second overlay mark unit 220 are sequentially arranged along a straight line, and the straight line is parallel to the second boundary line 2. At this time, the length of the second overlay mark unit 220 perpendicular to the direction of the second boundary line 2 is relatively small, or so to speak, the width of the second overlay mark unit 220 is relatively small, in other words, reduction in width of the second overlay mark unit 220 can reduce the width of the second boundary area 22, and hence reduce the dimension of the second boundary area 22.

Figure 13:
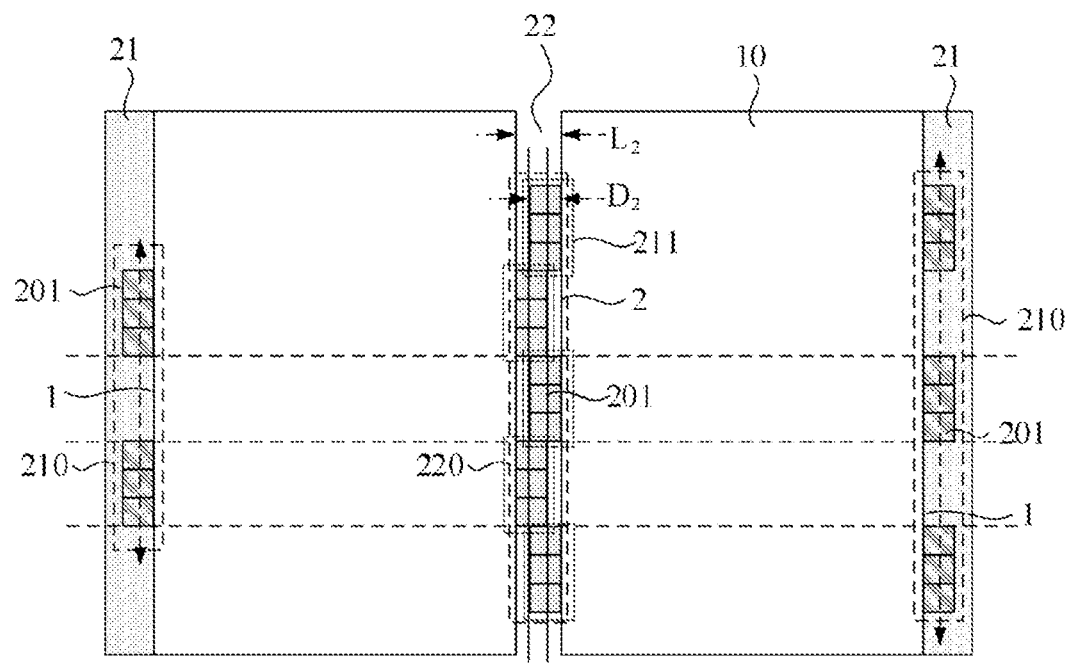
FIG. 13 is a diagram schematically illustrating still another mask reticle with part amplified as provided by an embodiment of the present disclosure.

Moreover, concerning the overlay marks in the second boundary area 22, their sizes can be designed according to the regional areas of the actual positions, so as to facilitate reduction in width of the second boundary area. FIG. 13 is a diagram schematically illustrating still another mask reticle with part amplified as provided by an embodiment of the present disclosure. Referring to FIG. 13, in one embodiment, taking the length of the second boundary area 22 perpendicular to the direction of the adjacent transversal or longitudinal second boundary lines 2 as $L_2$, and taking the length of the contour of the overlay mark 201 perpendicular to the extension direction of the second boundary line 2 as $D_2$, where $L_2$ and $D_2$ satisfy the relational expression: $4D_2/3 \leq L_2 \leq 2D_2$. At this time, the size of the second overlay mark unit 220 satisfies the width requirement of the second boundary area 22, while the width of the second boundary area 22 can be reasonably set so as to reduce dimension ratio of the second boundary area 22 in the mask reticle 1000.

Referring further to FIG. 13, exemplarily, it can also be set in the second boundary area 22 that each of the second overlay mark units 220 includes at least two overlay mark subunits 211, each of which includes a plurality of the overlay marks 201; the at least two overlay mark subunits 211 in each second overlay mark unit 220 are sequentially arranged along two straight lines, the two straight lines are parallel to each other, and both are parallel to the second boundary line 2; on the arrangement directions of the overlay marks, the overlay mark subunits 211 respectively on the two straight lines are displaced with respect to each other.

The overlay mark subunits 211 indicate the units formed by plural overlay marks 201, and are fewer in number relative to the overlay marks 201 in the second overlay mark units 220. The arranging of overlay marks 201 in the at least two overlay mark subunits 211 respectively along two straight lines means that the plural overlay mark subunits 211 are divided into two rows or two columns in the direction perpendicular to the second boundary line 2. Moreover, since $D2 \geq L2/2$, when plural overlay mark subunits 211 are divided into two rows or two columns, they should be disposed by displacement. In other words, under the circumstance in which the distance between adjacent exposure pattern areas 10 is determined, and when the size of the overlay marks is relatively large, the plural overlay marks 201 can be divided into plural overlay mark subunits 211, by arranging the plural overlay mark subunits 211 to be divided into two rows or two columns and performing displacement thereto at the same time, it is possible to efficiently utilize the second boundary area 22, to uniformly and reasonably configure positions of the overlay marks, to thereby realize enhancement of overlay precision through alignment of overlay marks at different positions.

The mask reticle 1000 provided on the basis of the aforementioned embodiments can effectively reduce the dimension ratio of the boundary area, and based on this, in order to enhance the efficiency of mask exposure, the number and layout of the exposure pattern areas can be reasonably set. As shown in FIG. 3 and FIG. 11, the number of columns of the plural exposure pattern areas 10 arranged in the mask reticle 1000 in an array can be set as at least two, and the number of rows thereof as at least five. By this time, the number of exposure pattern areas 10 transferrable on the mask reticle 1000 is increased, during the process of exposing wafer 2000, more pattern transfers can be made at a time, the speed of exposing wafer 2000 is enhanced, and exposing efficiency is improved. At the same time, reduction in dimension ratio of the boundary area of the mask reticle 1000 can correspondingly increase the utilization ratio of the wafer 2000, increase the number of chips fabricated on the wafer 2000, and finally realize improvement in efficiency of chip fabrication.

As should be noted, the above description is merely directed to preferred embodiments and technical principles of the present disclosure. As can be understood by persons skilled in the art, the present disclosure is not restricted to the specific embodiments described in this context, and persons skilled in the art are capable of making various apparent modifications, readjustments, combinations and substitutions without departing from the protection scope of the present disclosure. Accordingly, although the present disclosure is described in relative detail through the aforementioned embodiments, the present disclosure is not merely restricted to these embodiments, more equivalent embodiments made without departing from the conception of the present disclosure are also included, and the scope of the present disclosure is decided by the attached claims.

What is claimed is:

1. A mask, comprising a first boundary area and a plurality of exposure pattern areas, the plurality of exposure pattern areas being arranged in an array, the first boundary area including a region surrounding the plurality of exposure pattern areas; wherein
in the first boundary area is disposed a plurality of first overlay mark units, each of which includes a plurality of overlay marks, the first boundary area is provided with transversal and longitudinal first boundary lines corresponding to the plurality of exposure pattern areas arranged in an array, and the plurality of overlay marks are sequentially arranged along extension directions of adjacent transversal or longitudinal first boundary lines; and wherein
the plurality of first overlay mark units are symmetric in pairs with a central line of the mask reticle as a symmetric axis, and two mutually symmetric first overlay mark units form an overlay mark set; arrangement direction of the overlay marks in one of the first overlay mark units in the same overlay mark set is parallel to arrangement direction of the overlay marks in another one of the first overlay mark units, and, on the arrangement directions of the overlay marks, one overlay mark in the first overlay mark units is displaced with respect to another overlay mark in the first overlay mark units.

2. The mask according to claim 1, wherein the first overlay mark unit includes at least one overlay mark subunit, each including a plurality of the overlay marks; and wherein
on the arrangement directions of the overlay marks, the overlay mark subunit in one of the first overlay mark units in the same overlay mark set is displaced with respect to the overlay mark subunit in another one of the first overlay mark units.

3. The mask according to claim 2, wherein each overlay mark subunit includes three to five overlay marks.

4. The mask according to claim 1, wherein taking the length of the first boundary area perpendicular to the direction of the adjacent transversal or longitudinal first boundary lines as $L_1$, and taking the length of the contour of the overlay mark perpendicular to the direction of the transversal or longitudinal first boundary line as $D_1$, $L_1$ and $D_1$ satisfy the relational expression: $D_1 \leq L_1 \leq 2D_1$.

5. The mask according to claim 1, further comprising a second boundary area that includes a region between any two of the exposure pattern areas; wherein
in the second boundary area is disposed a plurality of second overlay mark units, each of which includes a plurality of overlay marks; and wherein
the second boundary area is provided with transversal and longitudinal second boundary lines corresponding to the plurality of exposure pattern areas arranged in an array, and the plurality of overlay marks are sequentially arranged along extension directions of adjacent transversal or longitudinal second boundary lines.

6. The mask according to claim 5, wherein the plurality of overlay marks in each of the second overlay mark units are sequentially arranged along a straight line, and the straight line is parallel to the second boundary lines.

7. The mask according to claim 5, wherein taking the length of the second boundary area perpendicular to the direction of the adjacent transversal or longitudinal second boundary lines as $L_2$, and taking the length of the contour of the overlay mark perpendicular to the extension direction of the second boundary line as $D_2$, $L_2$ and $D_2$ satisfy the relational expression: $4D_2/3 \leq L_2 \leq 2D_2$.

8. The mask according to claim 7, wherein in the second boundary area, each of the second overlay mark units includes at least two overlay mark subunits, each of which includes a plurality of the overlay marks; and wherein
the at least two overlay mark subunits in each second overlay mark unit are sequentially arranged along two straight lines, the two straight lines are parallel to each other, and both are parallel to the second boundary line; on the arrangement directions of the overlay marks, the overlay mark subunits respectively on the two straight lines are displaced with respect to each other.

9. The mask according to claim 1, wherein the first boundary area includes four sides, every two opposite the other, and the first overlay mark units are disposed on at least two end positions of each side.

10. The mask according to claim 1, wherein the number of columns of the plurality of exposure pattern areas arranged in an array are at least two, and the number of rows thereof are at least five.

* * * * *